United States Patent
McEachern et al.

(10) Patent No.: US 10,067,167 B2
(45) Date of Patent: Sep. 4, 2018

(54) METHOD AND APPARATUS FOR PRECISION PHASOR MEASUREMENTS THROUGH A MEDIUM-VOLTAGE DISTRIBUTION TRANSFORMER

(71) Applicant: Power Standards Lab Inc, Alameda, CA (US)

(72) Inventors: Alexander McEachern, Oakland, CA (US); Ronald Hofmann, Oakland, CA (US)

( * ) Notice: Subject to any disclaimer, the term of this patent is extended or adjusted under 35 U.S.C. 154(b) by 0 days.

(21) Appl. No.: 14/808,439

(22) Filed: Jul. 24, 2015

(65) Prior Publication Data
US 2017/0023627 A1 Jan. 26, 2017

(51) Int. Cl.
G01R 19/25 (2006.01)
G01R 15/18 (2006.01)
G01R 35/00 (2006.01)
G01R 31/02 (2006.01)

(52) U.S. Cl.
CPC ....... *G01R 19/2513* (2013.01); *G01R 15/183* (2013.01); *G01R 31/027* (2013.01); *G01R 35/005* (2013.01)

(58) Field of Classification Search
CPC .. G01R 25/00; G01R 31/027; G01R 19/2513; G01R 15/183; G01R 35/005
USPC ........................ 702/72, 60, 64, 85
See application file for complete search history.

(56) References Cited

U.S. PATENT DOCUMENTS

| | | | |
|---|---|---|---|
| 8,103,467 B2 | 1/2012 | Taft | |
| 8,386,200 B2 * | 2/2013 | Taft | G01R 19/2513 702/64 |
| 2012/0082048 A1 * | 4/2012 | Taft | H04L 12/1836 370/252 |
| 2014/0333323 A1 * | 11/2014 | Kabler | G01R 31/2836 324/511 |
| 2015/0010093 A1 * | 1/2015 | Hansell | G01R 29/18 375/257 |
| 2015/0120228 A1 * | 4/2015 | Kosaka | G01R 27/16 702/65 |
| 2016/0032896 A1 * | 2/2016 | Barton | F03D 9/003 290/44 |

(Continued)

FOREIGN PATENT DOCUMENTS

CN 103337864 * 10/2013

OTHER PUBLICATIONS

Micro Synchrophasors for Distribution Systems, Sasha Von Meier, CIEE, accessed on youtube Sep. 16, 2015 https://www.youtube.com/watch?v=Xr4w-hH3-vk , published on youtube Oct. 2, 2013.*

(Continued)

*Primary Examiner* — Mohamed Charioui
*Assistant Examiner* — Catherine Rastovski
(74) *Attorney, Agent, or Firm* — Haverstock & Owens LLP

(57) ABSTRACT

A means and method for measuring precise voltage phasors on medium-voltage alternating current (AC) distribution grids, using existing distribution transformers as voltage sensors. The errors introduced by the distribution transformers are minimized by taking into account the transformer's vector impedance, combined with measuring the transformer secondary current phasor. The invention includes a means and a method of measuring the distribution transformer's vector impedance.

12 Claims, 3 Drawing Sheets

(56) References Cited

U.S. PATENT DOCUMENTS

2016/0091537 A1* 3/2016 Gaarder ................ G06Q 10/00
324/764.01
2016/0154040 A1* 6/2016 Driscoll ................ G01R 25/00
324/76.77

OTHER PUBLICATIONS

R.K. Singh, Principles of Transformers, McGraw Hill Ed, India (2003).*
Hyperphysics: Impedance, http://hyperphysics.phy-astr.gsu.edu/hbase/electric/imped.html, Feb. 9, 2015.*
http://electrical-engineering-portal.com/voltage-instrument-transformer-vt-introduction (2012) accessed May 1, 2016.*
Chow et al. "Guidelines for Siting Phasor Measurment Units", North American SynchroPhasor Initiative Research Initiative Task Team RITT Report, Jun. 15, 2011.*
Von Meier, Alexandra et al., "Micro-Synchrophasors for Distribution Systems," U.S. Department of Energy ARPA-E Program, (2014), 5 pages.

* cited by examiner

METHOD AND APPARATUS FOR PRECISION PHASOR MEASUREMENTS THROUGH A MEDIUM-VOLTAGE DISTRIBUTION TRANSFORMER

STATEMENT REGARDING FEDERALLY SPONSORED RESEARCH OR DEVELOPMENT

The invention disclosed herein was conceived and developed in part during work on Award Number DE-AR0000340, titled "Micro-Synchrophasors for Distribution Systems," from the Advanced Research Projects Agency-Energy (ARPA-E) of the U.S. Department of Energy.

CROSS-REFERENCE TO RELATED APPLICATIONS

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention is in the technical field of measurement of electric parameters.

More particularly, the present invention is in the technical field of voltage phase angle measurements on an alternating current (a.c.) power grid.

The voltage and current on an a.c. power grid have a fundamental frequency, often one of the following: 50 Hertz, 60 Hertz, or 400 Hertz. For many applications, it can be useful to measure the phase angle of the voltage fundamental frequency, or the phase angle of the current fundamental frequency, or both. Such a measurement can be made either relative to the phase angle at a different physical location, or relative to a fixed time base such as that provided by the Global Positioning System. The measured fundamental angle can be combined with the measured fundamental magnitude to form a fundamental phasor measurement.

Phasor measurements can be equivalently expressed in polar coordinates, as an angle and a magnitude; or they can be expressed in Cartesian coordinates, typically for a.c. systems as a real and an imaginary component; or they can be expressed as a vector on a rotating Cartesian coordinate system that completes one rotation per nominal fundamental cycle; or they can be expressed in any other mathematically-equivalent way.

One known phasor application for a.c. grids, well known to those familiar with the art, is the synchrophasor application, in which the voltage phasor, current phasor, or both are examined simultaneously at two or more separate physical locations on an a.c. grid that connects those two or more locations. In this known application, the difference between phasors at the two separate physical locations may, for example, provide useful information about the power flow between those two locations.

Typically, synchrophasor applications have been applied to high-voltage power transmission systems, even if the measurements themselves are made on local low-voltage locations.

In those synchrophasor applications on transmission systems, the difference in phase angle between two separate physical locations can often be tens of degrees or more, and detecting interesting phenomena rarely requires a resolution better than about half a degree. Indeed, the IEEE Standard C37.118 (2011) for synchrophasor measurements only requires a Total Vector Error of 1% or better, which corresponds to approximately ±0.5°.

In our Department of Energy ARPA-E Project DE-AR0000340, titled "Micro-Synchrophasors for Distribution Systems," we have been investigating the application of synchrophasor measurements to medium-voltage distribution grids, as opposed to the traditional application to high-voltage transmission grids. Due to smaller inductances and shorter distances on distribution grids compared to transmission grids, the phase angle changes during interesting phenomena on distribution grids are much smaller. We have determined that, for distribution grid applications, a angular resolution for voltage phasors and current phasors of ±0.015° could be useful.

Transmission grids generally operate at 100,000 volts or higher, and distribution grids generally operate at 1,000 volts to 100,000 volts. As is well known in the art, to measure a.c. voltage on these grids it is necessary to proportionally reduce the a.c. voltage to an acceptable level for electronic devices, which conventionally measure signals that are less than 1,000 volts.

Typically, this proportional voltage reduction is done with transformers. One commonly-available type of transformer, which we will call a distribution transformer, is intended to supply a significant amount of power to a load, such as a group of residences or a factory, but can also be used for making phasor measurements. The medium-voltage primary winding of distribution transformers is connected to the distribution grid; the low-voltage secondary winding delivers power to consumers, and is at a level that can be measured by electronic devices.

In general, we are interested in making phasor measurements that indicate the voltage magnitudes and angles on the distribution conductors, but as a practical matter we instead measure the voltage phasors on the secondary windings of a transformer.

Consequently, any phase angle shifts that occur inside the transformer, between the primary winding and the secondary winding, will affect the accuracy and resolution of a voltage phasor measurement.

Prior to the present invention, it was believed by those familiar with the art that high-precision medium-voltage phasor measurements, using generally available distribution transformers, would be impossible. It is well known to those familiar with the art that the voltage phasor on the secondary winding of distribution transformers, where the measurement would take place, is strongly affected by the uncontrolled loads that are supplied by the secondary winding of a distribution transformer.

SUMMARY OF THE INVENTION

The present invention is a means and a method for making precise voltage phasor measurements on medium-voltage conductors of a distribution grid, using measurements that are made on the secondary of an existing distribution transformer that is supplying power to loads.

DETAILED DESCRIPTION OF THE INVENTION

Figure 1:
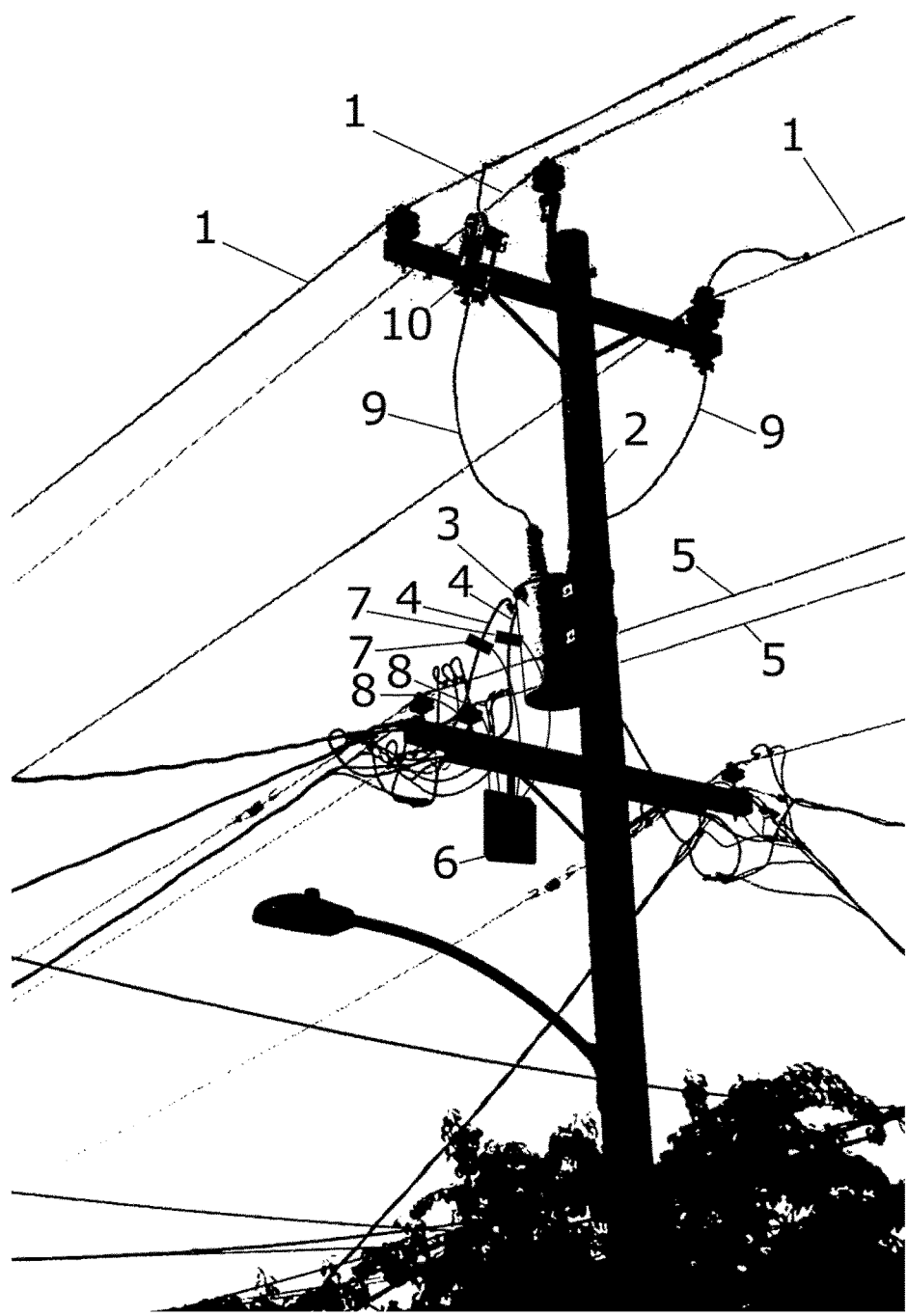
FIG. 1 is an illustration of the environment of the present invention.

Turning our attention to FIG. 1, we see distribution grid conductors 1 mechanically supported by a power pole 2. Mounted on the power pole 2 is a transformer 3. The transformer 3 could, for example, be a single-phase transformer having a ratio of 100:1 for converting 24 kilovolts on its primary winding to 240 volts on its secondary winding. The medium-voltage primary winding of the transformer 3 is connected through primary conductors 9 and a fuse 10 to the medium-voltage distribution grid conductors 1. The low-voltage secondary winding of the transformer 3 is connected through secondary conductors 4 to conductors 5 on a low-voltage distribution grid. In FIG. 1, we see an enclosure 6 for the present invention. The present invention, inside its enclosure 6, makes use of current sensors 7 on the secondary conductors 4, and also makes use of voltage sensing conductors 8, to make measurements of voltage phasors and current phasors on the low voltage secondary of transformer 3. These measured secondary voltage phasors and current phasors are used in the present invention to precisely determine the voltage phasors on the medium-voltage distribution grid conductors 1, as further described below.

Figure 2:
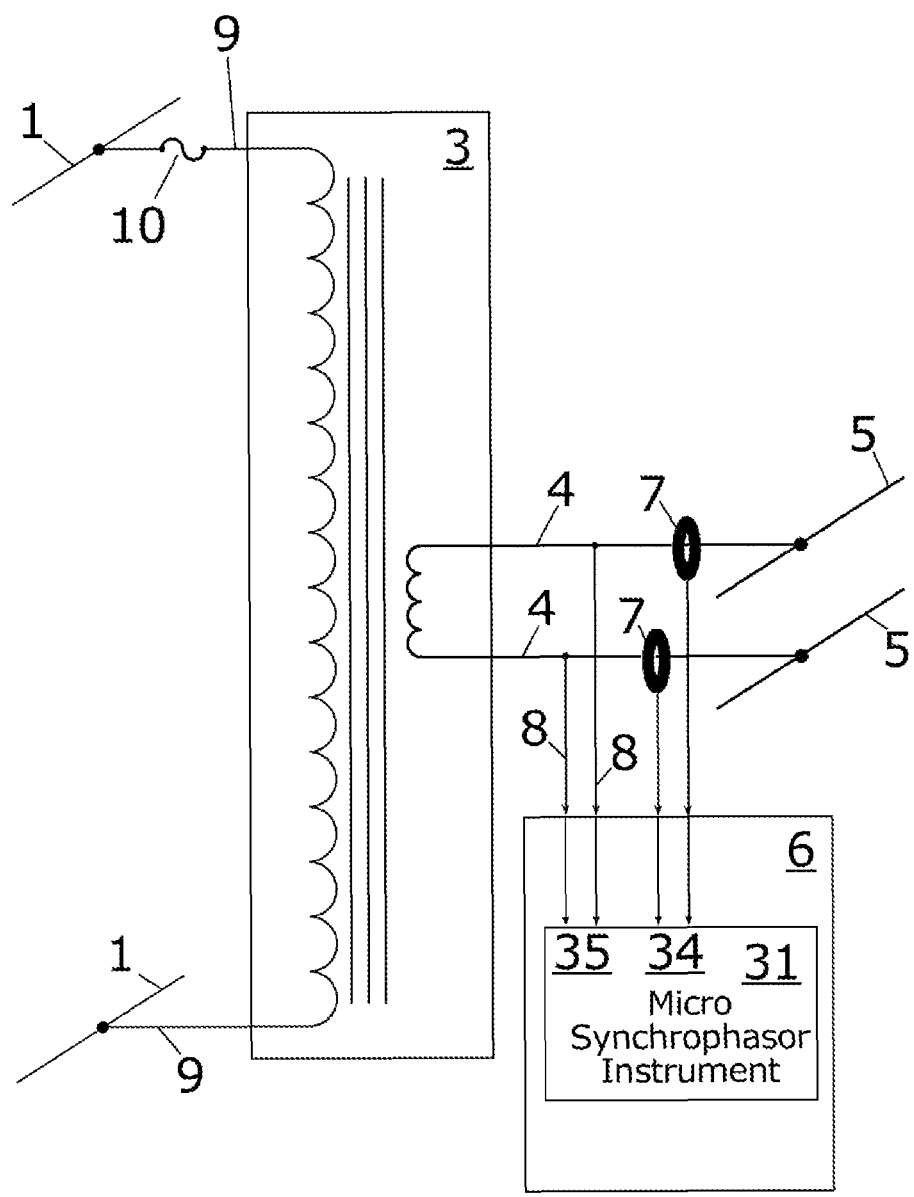
FIG. 2 is a schematic view of the key elements of FIG. 1.

Turning our attention now to FIG. 2, we see, in schematic form, many of the same elements that we saw in FIG. 1: distribution grid conductors 1, a transformer 3, primary conductors 9, a fuse 10, secondary conductors 4, conductors 5 on a low-voltage distribution grid, an enclosure 6 for the present invention, current sensors 7 on the secondary conductors 4, and voltage sensing conductors 8. We also see a Micro Synchrophasor Instrument 31, developed under the Department of Energy ARPA-E Award Number DE-AR0000340, which implements one possible embodiment of the present invention. The Micro Synchrophasor Instrument 31 has voltage inputs 35 with appropriate ratings for direct connection to the low-voltage secondary winding of the transformer 3, and has current inputs 34 with appropriate ratings for using current sensors 7 to measure the current flowing on the low-voltage secondary conductors 4.

Figure 3:
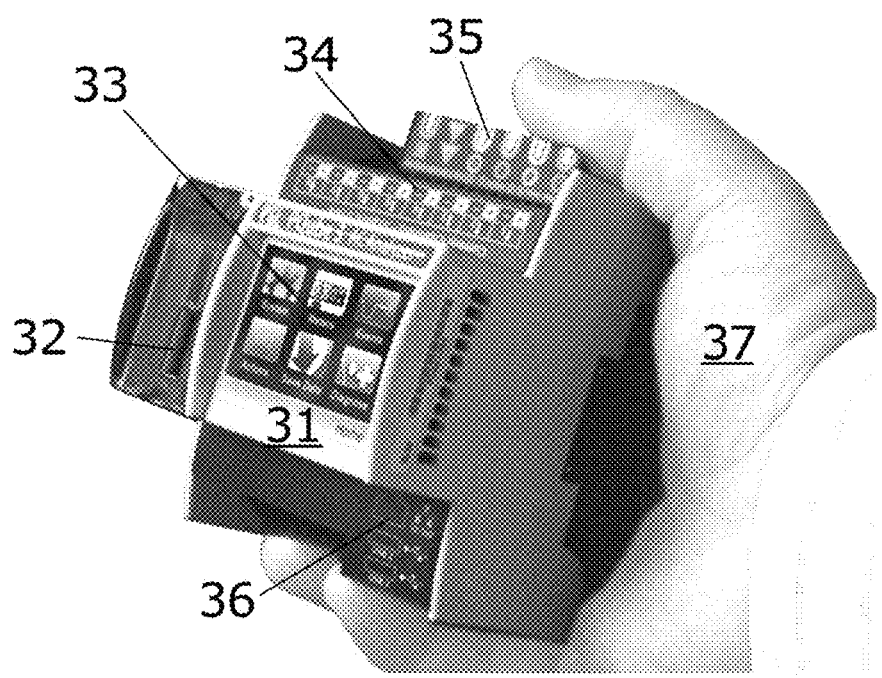
FIG. 3 is a view of one implementation of the present invention.

Turning our attention now to FIG. 3, we see an illustration of a Micro Synchrophasor Instrument 31 which implements one possible embodiment of the present invention. (The hand 37 in the illustration is shown to visually indicate approximate scale, and does not play any part in the present invention.) The Micro Synchrophasor Instrument 31 incorporates a display 33 and communications means 36, both of which are useful but not critical to the present invention. The Micro Synchrophasor Instrument 31 also incorporates voltage inputs 35 for measuring the low-voltage phasors on the secondary winding of the transformer 3, current inputs 34 for measuring the current flowing on the secondary conductors through current sensors, and computing means 32 for implementing the algorithm of the present invention, which is further described below.

In the present invention, we use measurements on the secondary, low-voltage conductors of a distribution transformer to precisely determine the voltage phasors on the primary, medium-voltage distribution grid conductors, which is also the voltage on the primary of the transformer, using the method explained further below.

We begin by making voltage phasor measurements and current phasor measurements on the secondary, low-voltage conductors, using any precise method known in the art. Combining these secondary voltage phasor measurements and secondary current phasor measurements with the effective ratio of the transformer primary winding to the transformer secondary winding, which can be found on the transformer nameplate, we implement the following equation to determine the parameter we want to measure: the phasor vector of the fundamental voltage on the primary winding of the transformer.

$$\vec{V}_{primary} = a_{transformer} \cdot (\vec{V}_{secondary} + (\vec{I}_{secondary} \cdot \vec{Z}_{transformer}))$$

$V_{primary}$ is the phasor vector of the fundamental voltage on the primary winding of the transformer, which is the parameter of interest;

$a_{transformer}$ is the effective ratio of the transformer primary winding to the transformer secondary winding;

$V_{secondary}$ is the measured phasor vector of the fundamental voltage on the secondary side of the transformer;

$I_{secondary}$ is the measured phasor vector of the fundamental current on the secondary side of the transformer; and $Z_{transformer}$ is the fundamental vector impedance of the transformer, as further described below.

Note that this equation requires that we know the fundamental vector impedance of the transformer.

In our invention, we measure the fundamental vector impedance of the transformer by observing the changes in our secondary voltage phasor measurements that occur simultaneously with changes in our secondary current phasor measurements. We approximate the relationship between those two measurements and the fundamental vector impedance of the transformer as follows:

$$\vec{Z}_{transformer} \cong \frac{\Delta \vec{V}_{secondary}}{\Delta \vec{I}_{secondary}}$$

$\Delta V_{secondary}$ is the measured phasor vector of a change, with respect to time, in fundamental voltage on the secondary side of the transformer, and $\Delta I_{secondary}$ is the measured phasor vector of a change, with respect to time, in fundamental current on the secondary side of the transformer.

As shown in this equation, the fundamental vector impedance $Z_{transformer}$ can be approximated by analyzing the measured vector change in secondary voltage that occurs approximately simultaneously with a detected vector change in the measurement of secondary current. It is an approximation of the fundamental vector impedance $Z_{transformer}$ for two reasons. First, the measured fundamental vector impedance is, in fact, the vector impedance of the transformer summed with the vector impedance of the grid that is upstream of the transformer primary; however, we have determined by experiment that the transformer vector impedance is almost always at least an order of magnitude larger than the upstream grid's vector impedance. Second, there can be changes in measured phasor vector of the fundamental voltage on the secondary side of the transformer that are caused by external factors other than changes in the phasor vector in the fundamental current on the secondary side of the transformer, such external factors including voltage sags on the primary, transformer tap changes, and other well-known events that affect transformer secondary voltage.

To minimize the effect of these kinds of external factors, in our invention the approximation of the fundamental vector impedance $Z_{transformer}$ may be calculated directly as described above, or it may be further refined using one or more of the following three methods:

Threshold: For the purposes of calculating $Z_{transformer}$, changes in $\Delta V_{secondary}$ are ignored unless they occur simultaneously with a change in $\Delta I_{secondary}$ that exceeds some threshold in vector magnitude, or exceeds some threshold in some parameter associated with the current phasor such as its real component or its imaginary component. This threshold may be fixed, or it may be determined by an algorithm that adapts this threshold to a history of measurements.

Statistical correlation: For the purposes of calculating $Z_{transformer}$, which is in the present invention is approximated by a ratio, a statistical correlation may be used to calculate the most likely ratio between a large number of measured changes in $\Delta I_{secondary}$ and a change in $\Delta V_{secondary}$. For example, the slope of a linear least-squares fit could be used; or a statistical process that gives more weight to points that have a large change in current phasor could be used; or any other statistical method known to those familiar with the art could be used to extract an optimal ratio from a collection of $\Delta I_{secondary}$ and $\Delta V_{secondary}$ pairs.

Intentional change in secondary current vector: the present invention relies on changes in $\Delta I_{secondary}$, which almost always naturally occur in distribution transformer loads. In one implementation of the present invention, a measurement of $Z_{transformer}$ can be made by intentionally adding and removing load from the secondary of the distribution transformer. In another embodiment, the adding and removing are done in a timed pattern that permits extraction of relatively small signals from background noise using methods well-known in the art, such as fixed-frequency adding and removing combined with Fourier analysis; or random adding and removing combined with auto-correlation.

It will be apparent to one of ordinary skill that the above description, which assumes a single-phase system, can be readily extended to three-phase systems.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

We claim:

1. In an alternating current power distribution network including at least a medium-voltage portion having a first plurality of conductors and a low-voltage portion having a second plurality of conductors, wherein the low voltage portion is coupled to provide power to a plurality of uncontrolled loads, further including a transformer coupled between the medium-voltage portion and the low-voltage portion for transforming a medium voltage to a low voltage, and further including a single synchrophasor instrument physically at located and coupled directly to the transformer, a method of the synchrophasor instrument comprising the steps of:

coupling voltage inputs of the synchrophasor instrument with voltage sensors external to the synchrophasor instrument to thereby measure a plurality of fundamental secondary voltage phasors on the second plurality of conductors;

coupling current inputs of the synchrophasor instrument with current sensors external to the synchrophasor instrument to thereby measure a plurality of fundamental secondary current phasors on the second plurality of conductors;

using changes with respect to time in the fundamental secondary voltage phasor measurements and simultaneous changes with respect to time in the fundamental secondary current phasor measurements to determine a fundamental vector impedance of the transformer, wherein the fundamental vector impedance of the transformer is a complex ratio of the changes with respect to time in the fundamental secondary voltage phasor measurements to the simultaneous changes with respect to time in the fundamental secondary current phasor measurements; and using the determined vector impedance of the transformer and the measured voltage phasors and the measured current phasors to determine the voltage phasors on the first plurality of conductors.

2. The method according to claim 1 wherein the step of using changes with respect to time in voltage phasor measurements and simultaneous changes with respect to time in current phasor measurements to determine a fundamental vector impedance of the transformer ignores changes below predetermined thresholds.

3. The method according to claim 2 where in the thresholds have fixed values.

4. The method according to claim 1 wherein the step of using changes with respect to time in voltage phasor measurements and changes with respect to time in current phasor measurements to determine a fundamental vector impedance of the transformer applies statistical weighting in such a way that the simultaneous changes in the fundamental secondary current phasor measurements that have a larger vector magnitude receive more weight.

5. The method according to claim 1 wherein the step of using changes with respect to time in voltage phasor measurements and changes with respect to time in current phasor measurements to determine a fundamental vector impedance of the transformer further comprises at least one of adding and removing intentional loads to and from the secondary conductors at predetermined times.

6. In an alternating current power distribution network including at least a medium-voltage portion having a first plurality of conductors and a low-voltage portion having a second plurality of conductors, wherein the low voltage portion is coupled to provide power to a plurality of uncontrolled loads, further including a transformer coupled between the medium-voltage portion and the low-voltage portion for transforming a medium voltage to a low voltage, and further including a single synchrophasor instrument physically located at and directly coupled to the transformer, the single synchrophasor instrument comprising:

voltage inputs coupled to voltage sensors external to the synchrophasor instrument to measure a plurality of fundamental secondary voltage phasors on the second plurality of conductors;

current inputs coupled to current sensors external to the synchrophasor instrument to measure a plurality of fundamental secondary current phasors on the second plurality of conductors; and an algorithm adapted for using changes with respect to time in the fundamental secondary voltage phasor measurements and changes with respect to time in the fundamental secondary current phasor measurements to determine a fundamental vector impedance of the transformer and for using the measured voltage phasors and the measured current phasors to determine the voltage phasors on the first plurality of conductors in light of the determined vector impedance of the transformer, wherein the fundamental vector impedance of the transformer is a complex ratio of the changes with respect to time in the fundamental secondary voltage phasor measurements to the simultaneous changes with respect to time in the fundamental secondary current phasor measurements.

7. The apparatus according to claim 6 wherein the algorithm ignores changes below predetermined thresholds.

8. The apparatus according to claim 7 where in the thresholds have fixed values.

9. The apparatus according to claim 6 wherein the algorithm applies statistical weighting in such a way that the simultaneous changes in the fundamental secondary current phasor measurements that have a larger vector magnitude receive more weight.

10. The apparatus according to claim 6 wherein at least part of the changes with respect to time in the fundamental secondary current phasor measurements is caused by adding or removing intentional loads to or from the secondary conductors at predetermined times.

11. In an alternating current power distribution network including at least a medium-voltage portion having a first plurality of conductors and a low-voltage portion having a second plurality of conductors, wherein the low voltage portion is coupled to provide power to a plurality of uncontrolled loads, further including a transformer having a known effective ratio of its primary winding to its secondary winding and coupled between the medium-voltage portion and the low-voltage portion for transforming a medium voltage to a low voltage, and further including a single synchrophasor instrument physically located at and directly coupled to the transformer, a method of the synchrophasor instrument comprising the steps of:
   coupling voltage inputs of the synchrophasor instrument with voltage sensors external to the synchrophasor instrument to thereby measure fundamental secondary voltage phasors on the second plurality of conductors;
   coupling current inputs of the synchrophasor instrument with current sensors external to the synchrophasor instrument to thereby measure fundamental secondary current phasors on the second plurality of conductors;
   determining a fundamental vector impedance of the transformer as a complex ratio of changes with respect to time in the fundamental secondary voltage phasor measurements to simultaneous changes with respect to time in the fundamental secondary current phasor measurements; and
   using the known effective ratio and the determined vector impedance of the transformer, the measured voltage phasors and the measured current phasors to determine the voltage phasors on the first plurality of conductors.

12. In an alternating current power distribution network including at least a medium-voltage portion having a first plurality of conductors and a low-voltage portion having a second plurality of conductors, wherein the low voltage, portion is coupled to provide power to a plurality of uncontrolled loads, further including a transformer having a known effective ratio of its primary winding to its secondary winding and coupled between the medium-voltage portion and the low-voltage portion for transforming a medium voltage to a low voltage, and further including a single synchrophasor instrument physically located at and directly coupled to the transformer, the single synchrophasor instrument comprising:
   voltage inputs coupled to voltage sensors external to the synchrophasor instrument to measure fundamental secondary voltage phasors on the second plurality of conductors;
   current inputs coupled to current sensors external to the synchrophasor instrument to measure fundamental secondary current phasors on the second plurality of conductors; and
   an algorithm configured to determine a fundamental vector impedance of the transformer as a complex ratio of changes with respect to time in the fundamental secondary voltage phasor measurements to simultaneous changes with respect to time in the fundamental secondary current phasor measurements, and to determine the voltage phasors on the first plurality of conductors from the measured voltage phasors, the measured current phasors, the known effective ratio and the determined vector impedance of the transformer.

* * * * *